(12) United States Patent
Hamzaoglu et al.

(10) Patent No.: US 6,351,156 B1
(45) Date of Patent: Feb. 26, 2002

(54) NOISE REDUCTION CIRCUIT

(75) Inventors: Fatih Hamzaoglu, Charlottesville, VA (US); Yibin Ye; Dinesh Somasekhar, both of Hillsboro, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/740,104

(22) Filed: Dec. 18, 2000

(51) Int. Cl.⁷ .................................................. H03F 3/45
(52) U.S. Cl. ...................... 327/57; 365/189.11; 365/205
(58) Field of Search ............................... 327/51, 52, 57, 327/309, 384; 365/154, 156, 189.11, 205, 204, 206, 207, 208; 330/252, 253

(56) References Cited

U.S. PATENT DOCUMENTS

| | | | |
|---|---|---|---|
| 5,619,149 A | 4/1997 | Lev et al. ....................... 327/51 |
| 5,850,359 A | 12/1998 | Liu ............................... 365/156 |
| 5,912,838 A * | 6/1999 | Chevallier ................... 365/206 |
| 5,943,278 A * | 8/1999 | Su ............................... 365/204 |
| 6,041,008 A * | 3/2000 | Marr ......................... 365/225.7 |
| 6,061,278 A * | 5/2000 | Kato et al. .................... 365/205 |
| 6,137,319 A | 10/2000 | Krishnamurthy et al. ..... 327/51 |
| 6,198,677 B1 * | 3/2001 | Hsu et al. .................... 365/207 |

* cited by examiner

Primary Examiner—Timothy P. Callahan
Assistant Examiner—Linh Nguyen
(74) Attorney, Agent, or Firm—Schwegman, Lundberg, Woessner & Kluth, P.A.

(57) ABSTRACT

A circuit and method for reducing noise in a memory circuit is disclosed. In one embodiment, the circuit includes an amplifier, a first transistor and a second transistor. The first transistor is capable of pulling up a first input port of the amplifier in response to a complement of the second memory signal. The second transistor is capable of pulling of a second input port of the amplifier in response to a complement of the first memory signal. In one embodiment, the method includes receiving a first memory signal at a first input port of an amplifier, receiving a second memory signal at a second input port of the amplifier, and pulling up the second input port in response to a complement of the first memory signal.

24 Claims, 8 Drawing Sheets

NOISE REDUCTION CIRCUIT

FIELD

The present invention relates to electronic circuits, and more particularly, to a noise reduction circuit.

BACKGROUND

The building blocks of digital systems, such as computers, communication networks, and video information systems, include logic circuits and memory circuits. Logic circuits and memory circuits each have a characteristic delay time. For a logic circuit, the characteristic delay time is the time it takes a logic signal at an input port of the logic circuit to propagate to an output port of the logic circuit. For a memory circuit, the characteristic delay time is the time it takes a bit value in a memory circuit bit cell to propagate to an output port of the memory circuit. One way to build faster and more powerful digital systems is to decrease the circuit delay times of the building blocks.

Logic circuit delay times are decreasing by about 30% with each new generation of circuits in a circuit family. However, memory circuit delay times are not improving at the same rate. For example, the combined bit-line delay and sense amplifier delay in a high performance on-chip cache utilizing differential low-swing sensing is not improving at a 30% rate because the offset voltage of the sense amplifier does not scale. One solution to this problem is to use a single-ended full-swing sense amplifier, which does support voltage scaling.

The bit-line delay in a memory circuit is improved (decreased) by decreasing the threshold voltage of the pass transistors that couple stored data bits to the bit-lines. Decreasing the threshold voltage of a pass transistor in a memory cell decreases the turn-on time of the pass transistor, which decreases the time required to read a bit from a bit-cell. Unfortunately, decreasing the threshold voltage of the pass transistors in a memory also increases the leakage current coupled to the bit-lines in the memory. And when the bit-lines are precharged in preparation for reading a bit-cell, the leakage current in the bit-cells not being read increases the noise on the bit lines. The noise includes white or pink noise and droop on the bit-line during a read operation. Increasing the noise on the bitlines increases the memory read error rate.

For these and other reasons there is a need for the present invention.

DESCRIPTION

Figure 1:
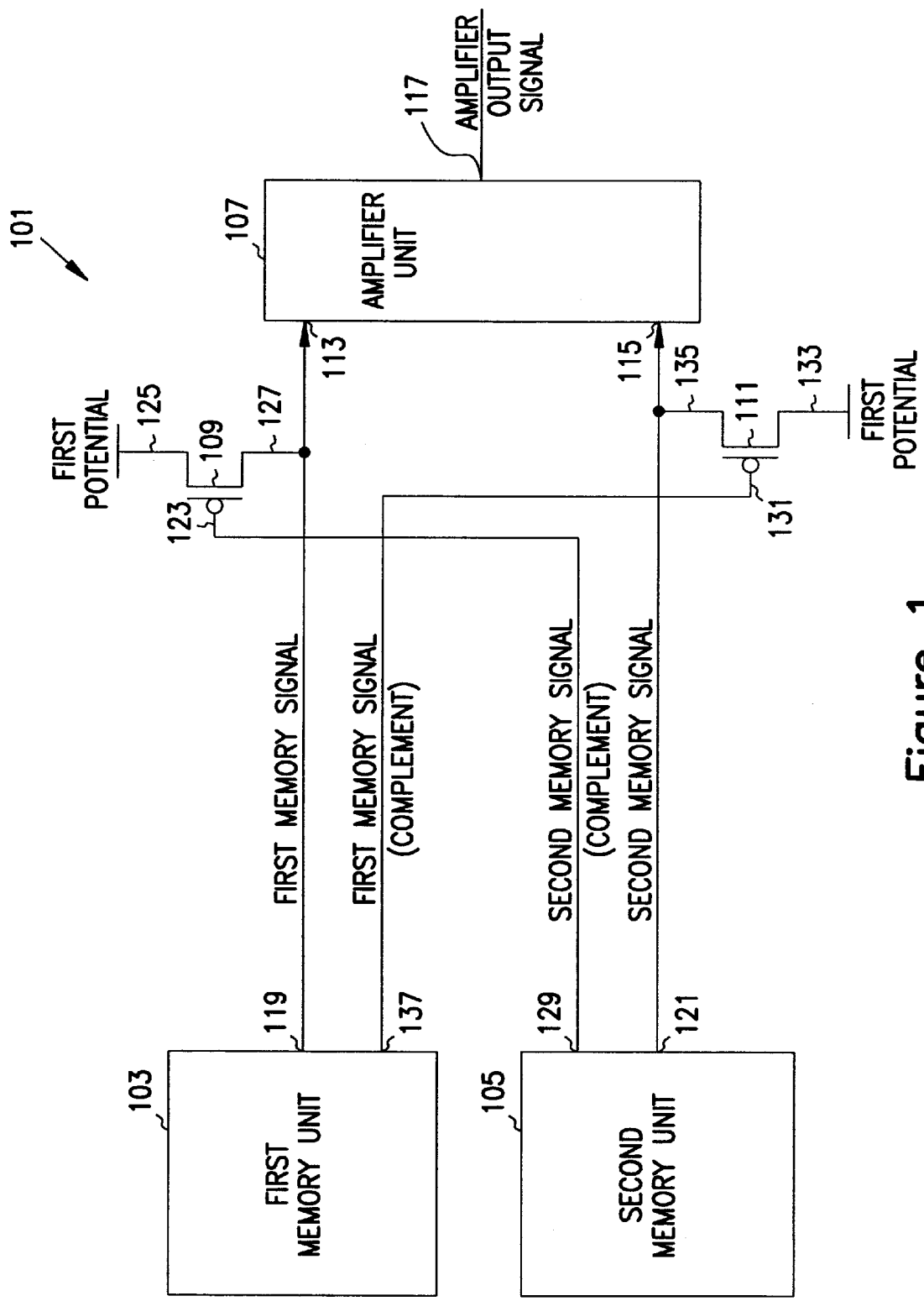
FIG. 1 is a block diagram of one embodiment of a noise reduction circuit according to the teachings of the present invention.

In the following detailed description of the invention, reference is made to the accompanying drawings which form a part hereof, and in which are shown, by way of illustration, specific embodiments of the invention which may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is not to be taken in a limiting sense, and the scope of the present invention is defined only by the appended claims, along with the full scope of equivalents to which such claims are entitled.

The circuit and method of the present invention are capable of reducing noise in a memory circuit. The circuit includes an amplifier, a first transistor, and a second transistor. The amplifier receives a first memory signal at a first input port and a second memory signal at a second input port. The first transistor is capable of pulling up first memory signal at the first input port of the amplifier in response to a complement of the second memory signal. The second transistor is capable of pulling up the second memory signal at the second input port of the amplifier in response to a complement of the first memory signal. When reading a logical one on the first memory signal, pulling up the second input port substantially reduces noise on the second memory signal, and as a result, the noise at the output port of the amplifier is reduced. When reading a logical one on the second memory signal, pulling up the first input port substantially reduces noise on the first memory signal, and as a result, the noise at the output port of the amplifier is reduced.

FIG. 1 is a block diagram of one embodiment of a noise reduction circuit 101 according to the teachings of the present invention. Noise reduction circuit 101 includes a first memory unit 103, a second memory unit 105, an amplifier unit 107, a first noise reduction transistor 109, and a second noise reduction transistor 111. The amplifier unit 107 includes input ports 113 and 115 and output port 117. The input port 113 is coupled to an output port 119 of the first memory unit 103. The input port 115 is coupled to an output port 121 of the second memory unit 105. The first noise reduction transistor 109 has a gate 123, a drain/source 125, and a drain/source 127. The gate 123 is coupled to an output port 129 of the second memory unit 105, the drain/source 125 is coupled to a first potential, and the drain/source 127 is coupled to an output port 119 of the first memory unit 103. The second noise reduction transistor 111 has a gate 131, a drain/source 133, and a drain/source 135. The gate 131 is coupled to an output port 137 of the first memory unit 103, the drain/source 133 is coupled to the first potential, and the drain/source 135 is coupled to an output port 121 of the second memory unit 105.

The noise reduction circuit 101 is not limited to use in connection with a particular type of amplifier unit 107. The amplifier unit 107 is preferably a single ended sense amplifier. In one embodiment, the amplifier unit 107 is a two-input static NAND gate. In an alternative embodiment, the amplifier unit 107 is a two-input dynamic NAND gate. The amplifier unit 107 is not limited to being fabricated using a particular fabrication process. In one embodiment, the amplifier unit 107 is fabricated using a complementary metal-oxide semiconductor process.

The first noise reduction transistor 109 and the second noise reduction transistor 111 are not limited to a particular type of transistor. In one embodiment, the first noise reduction transistor 109 and the second noise reduction transistor 111 are p-channel metal-oxide-semiconductor transistors. In an alternative embodiment, the first noise reduction transistor 109 and the second noise reduction transistor 111 are low threshold voltage transistors.

Figure 2:
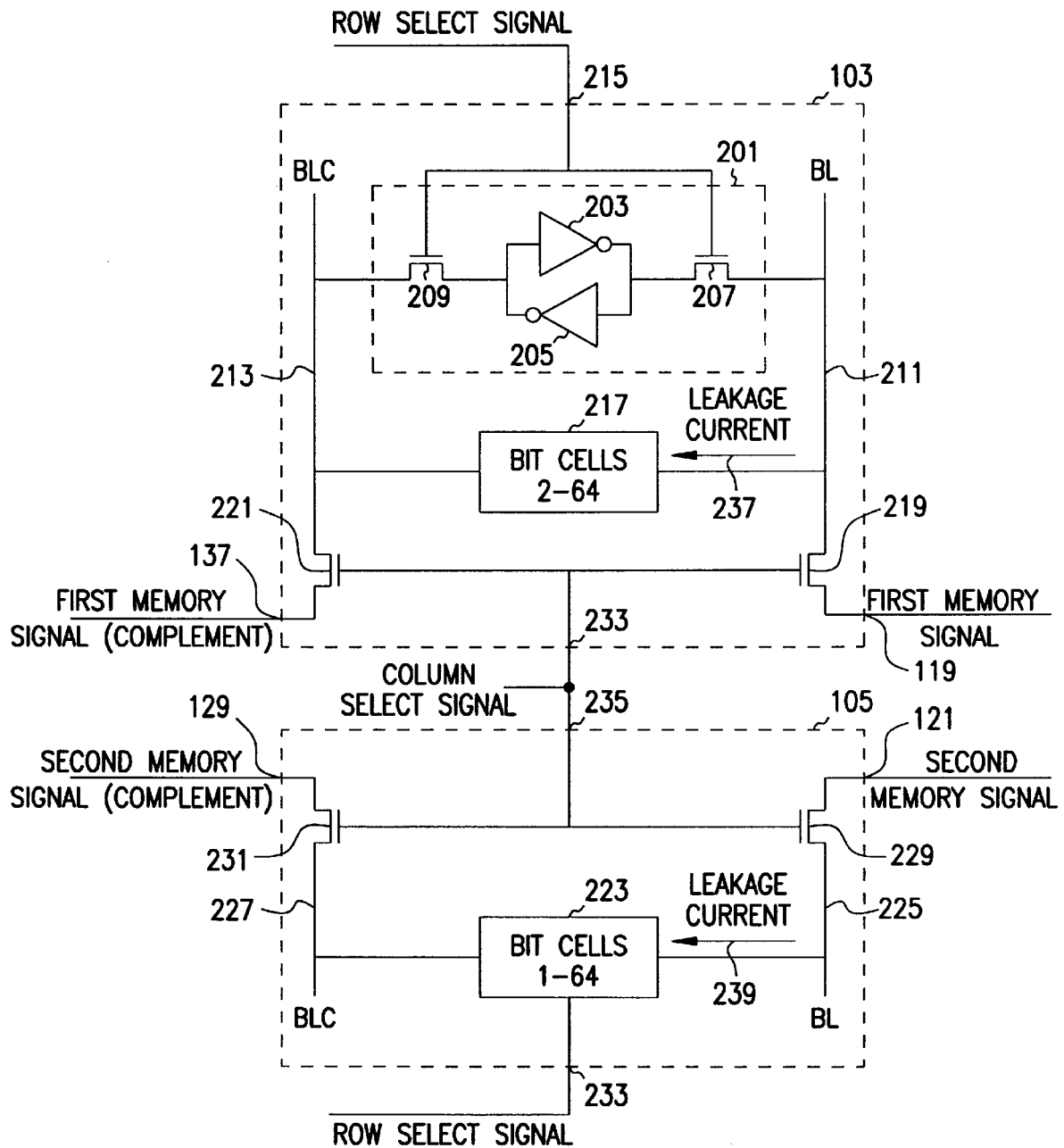
FIG. 2 is a schematic diagram of one embodiment of the first memory unit and the second memory unit shown in FIG. 1.

The noise reduction circuit 101 is not limited to use in connection with a particular type of first memory unit 103 or second memory unit 105. FIG. 2 is a schematic diagram of one embodiment of the first memory unit 103 and the second memory unit 105 shown in FIG. 1. The first memory unit 103 and the second memory unit 105 shown in FIG. 1 are sometimes referred to as static random-access-memory (SRAM).

The first memory unit 103 includes sixty-four bit-cells. Bit-cell one 201 includes inverters 203 and 205 connected to pass transistors 207 and 209. The present invention is not limited to use in connection with pass transistors having a particular threshold level. The pass transistors 207 and 209 can be low threshold transistors or high threshold transistors. The pass transistor 207 electrically couples an output of inverter 203 and an input of inverter 205 to bit-line (BL) 211. The pass transistor 209 electrically couples an output of inverter 205 and an input of inverter 203 to bit-line complement (BLC) 213. The pass transistors 207 and 209 are controlled by a common ROW SELECT SIGNAL received at the input port 215. Bit-cells two to sixty-four 217 are connected in parallel with the bit-cell one 201 between the BL 211 and the BLC 213. The BL 211 is coupled to the output port 119 through column select transistor 219, and BLC 213 is coupled to the output port 137 through the column select transistor 221.

Second memory unit 105 includes bit-cells one-to-sixty-four 223 connected between bit-line (BL) 225 and bit-line complement (BLC) 227. BL 225 is coupled to output port 121 through column select transistor 229, and BLC 227 is coupled to output port 129 through column select transistor 231. Each of the bit-cells one to sixty-four 223 is controlled by a separate ROW SELECT SIGNAL. However, for illustration purposes only a single ROW SELECT SIGNAL received at node 233 is shown in FIG. 2. Column select transistors 219 and 221 of the first memory unit 103 and column select transistors 229 and 231 of the second memory unit 105 are controlled by a common COLUMN SELECT SIGNAL received at input port 233 of first memory unit 103 and input port 235 of second memory unit 105.

In reading a logical one from the bit-cell one 201 of the first memory unit 103, the bit-lines 211 and 225 and the bit-lines complement 213 and 227 are charged to a first potential, such as $V_{CC}$, which is sometimes referred to as an equilibrate voltage or a full pre-charge voltage. (The circuits for generating the first potential are known in the art and are therefore not shown.) The first potential back biases gate-to-substrate junctions in each pass transistor (not shown) included in the bit-cells two-to-sixty-four 217 and bit-cells one-to-sixty-four 223 that are not being read, which creates leakage currents 237 and 239. The leakage currents 237 and 239 superimpose a noise voltage on the first potential on the bit-lines 211, 213, 225, and 227. After the bit-lines 211, 213, 225 and 227 are charged to the first potential, the COLUMN SELECT SIGNAL is asserted at input ports 233 and 235, which turns on transistors 219, 221, 229, and 231 and couples BL 211 to output port 119, BL 225 to output port 121, BLC 213 to output port 137, and BLC 227 to output port 129. The ROW SELECT SIGNAL 215 is asserted at input port 215, which couples the output port of inverter 203 to BL 211 and the output port of inverter 205 to BLC 213.

Referring again to FIG. 1, in a read operation of a logical one from the first memory unit 103, the FIRST MEMORY SIGNAL at output port 119 of the first memory unit 103 and the input port 113 of the amplifier unit 107 is held at about a first potential. The FIRST MEMORY SIGNAL (COMPLEMENT) at output port 137 of the first memory unit 103 and the gate 131 of the noise reduction transistor 111 is pulled down from the first potential toward a second potential. When the FIRST MEMORY SIGNAL (COMPLEMENT) reaches the threshold potential of the second noise reduction transistor 111, the second noise reduction transistor 111 turns on and holds the SECOND MEMORY SIGNAL at the output port 121 of the second memory unit 105 and the input port 115 of the amplifier unit 107 at about the first potential, which substantially cancels leakage noise on the SECOND MEMORY SIGNAL and prevents the SECOND MEMORY SIGNAL from drooping. The FIRST MEMORY SIGNAL at the input port 113 of the amplifier unit 107 is logically ANDED with the SECOND MEMORY SIGNAL at the input port 115 of the amplifier unit 107 and the AMPLIFIER OUTPUT SIGNAL at output port 117 of the amplifier unit 107 stays at a second potential, which is a logical zero value.

Figure 3:
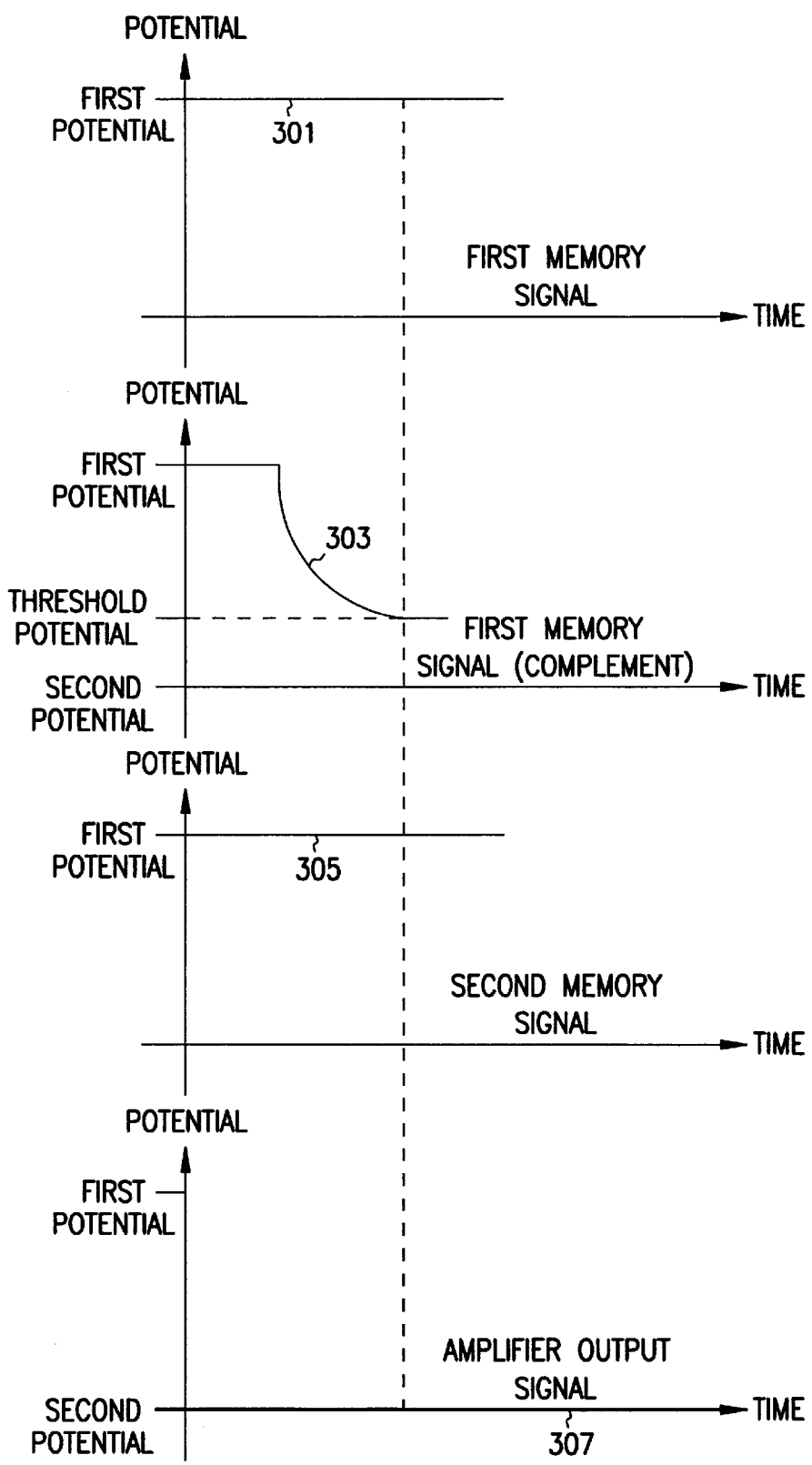
FIG. 3 is a timing diagram showing the relationship between signals in the noise reduction circuit shown in FIG. 1 during a read operation of a logical one from the first memory unit.

FIG. 3 is a timing diagram showing the relationship between FIRST MEMORY SIGNAL 301, FIRST MEMORY SIGNAL (COMPLEMENT) 303, SECOND MEMORY SIGNAL 305, and AMPLIFIER OUTPUT SIGNAL 307 during a read operation of a logical one from the first memory unit 105.

Referring again to FIG. 1, in a read operation of a logical one from the second memory unit 105, the SECOND MEMORY SIGNAL at output port 121 of the second memory unit 105 and the input port 115 of the amplifier unit 107 is held at about a first potential. The SECOND MEMORY SIGNAL (COMPLEMENT) at output port 129 of the second memory unit 105 and the gate 123 of the first noise reduction transistor 109 is pulled down from the first potential toward a second potential. When the SECOND MEMORY SIGNAL (COMPLEMENT) reaches the threshold potential of the first noise reduction transistor 109, the first noise reduction transistor 109 turns on and holds the FIRST MEMORY SIGNAL at the output port 119 of the first memory unit 103 and the input port 113 of the amplifier unit 107 at about the first potential, which substantially cancels leakage noise on the FIRST MEMORY SIGNAL and prevents the FIRST MEMORY SIGNAL from drooping. The SECOND MEMORY SIGNAL at the input port 115 of the amplifier unit 107 is logically ANDED with the FIRST MEMORY SIGNAL at the input port 113 of the amplifier unit 107 and the AMPLIFIER OUTPUT SIGNAL at output port 117 of the amplifier unit 107 stays at a second potential, which is a logical zero value.

Figure 4:
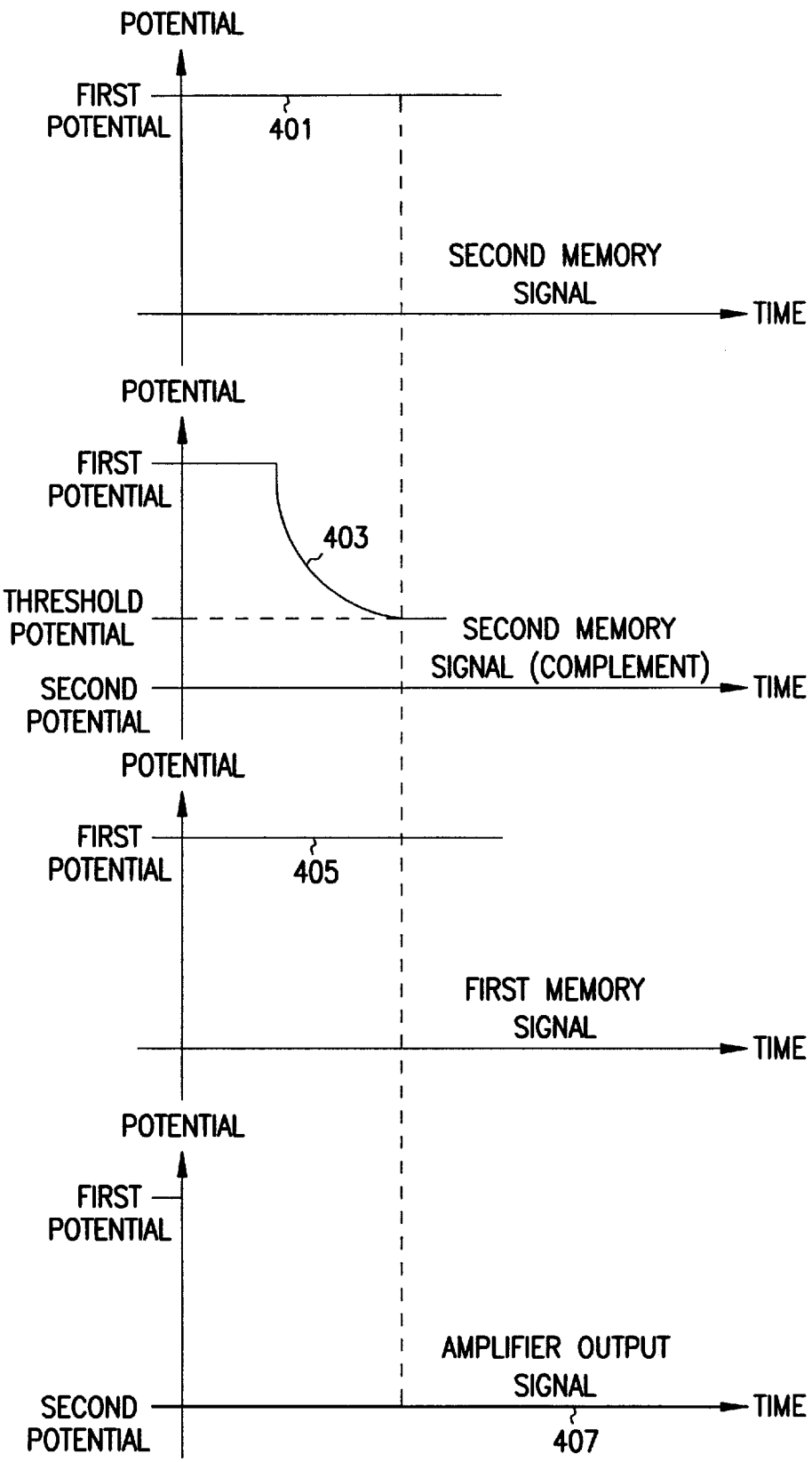
FIG. 4 is a timing diagram showing the relationship between signals in the noise reduction circuit shown in FIG. 1 during a read operation of a logical one from the second memory unit.

FIG. 4 is a timing diagram showing the relationship between SECOND MEMORY SIGNAL 401, SECOND MEMORY SIGNAL (COMPLEMENT) 403, FIRST MEMORY SIGNAL 405, and AMPLIFIER OUTPUT SIG- NAL 407 during a read operation of a logical one from the second memory unit 105.

Figure 5:
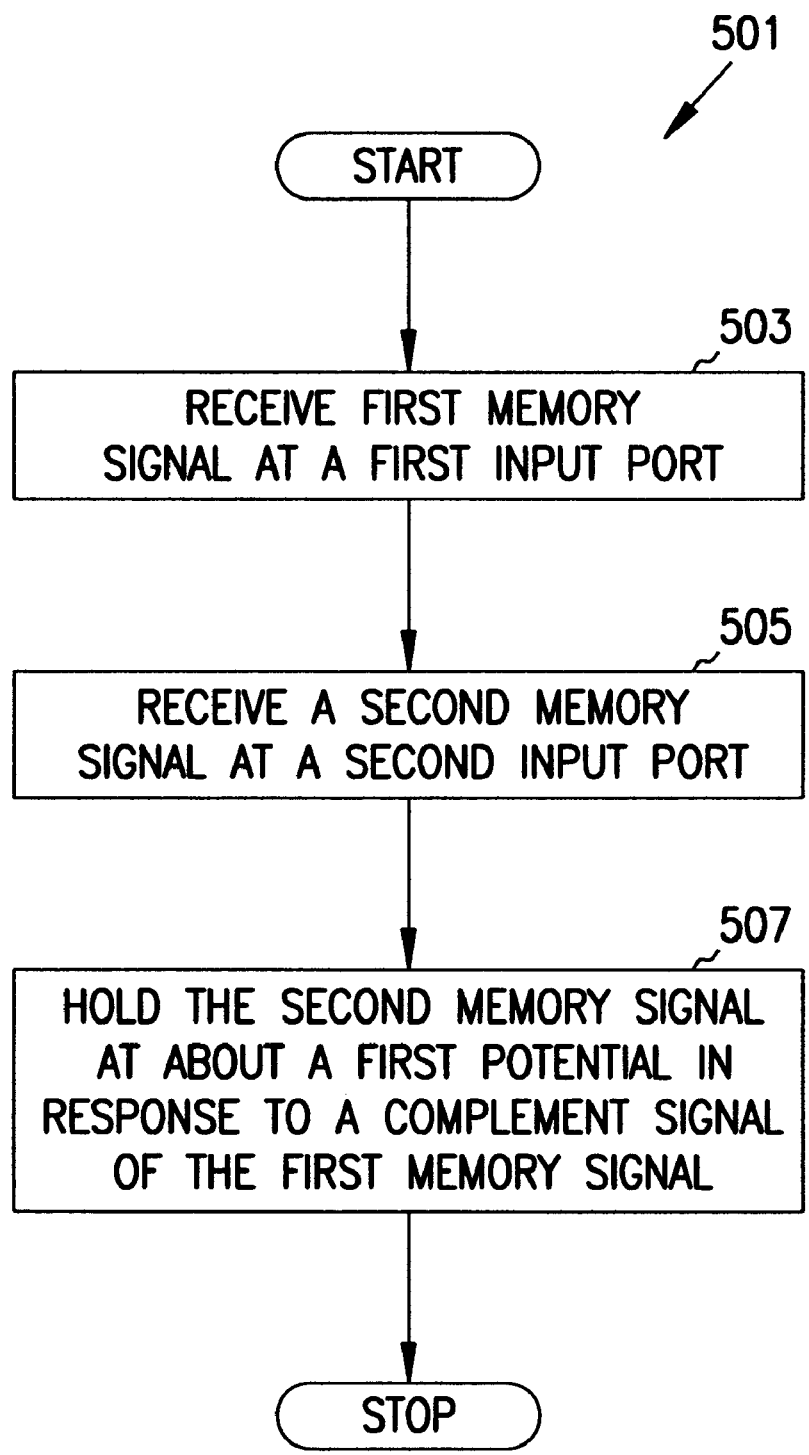
FIG. 5 is a flow diagram of one embodiment of a method of reading a memory according to the teachings of the present invention.

FIG. 5 is a flow diagram of one embodiment of a method 501 of reading a memory according to the teachings of the present invention. The method 501 includes receiving a first memory signal at a first input port of an amplifier at block 503, receiving a second memory signal at a second input port of the amplifier at block 505, and holding the second memory signal at the second input port at about a first potential in response to a complement signal of the first memory signal. In an alternative embodiment, receiving a first memory signal at a first input port of an amplifier includes receiving the first memory signal having about the first potential at the first input port, and holding the first memory signal at about the first potential. In another alternative embodiment, receiving a second memory signal at a second input port of the amplifier includes receiving the second memory signal having about the first potential at the second input port, and holding the second memory signal at about the first potential. In still another alternative embodiment, holding the first memory signal at about the first potential includes holding the first memory signal at about the first potential in response to a complement signal of the second memory signal.

Figure 6:
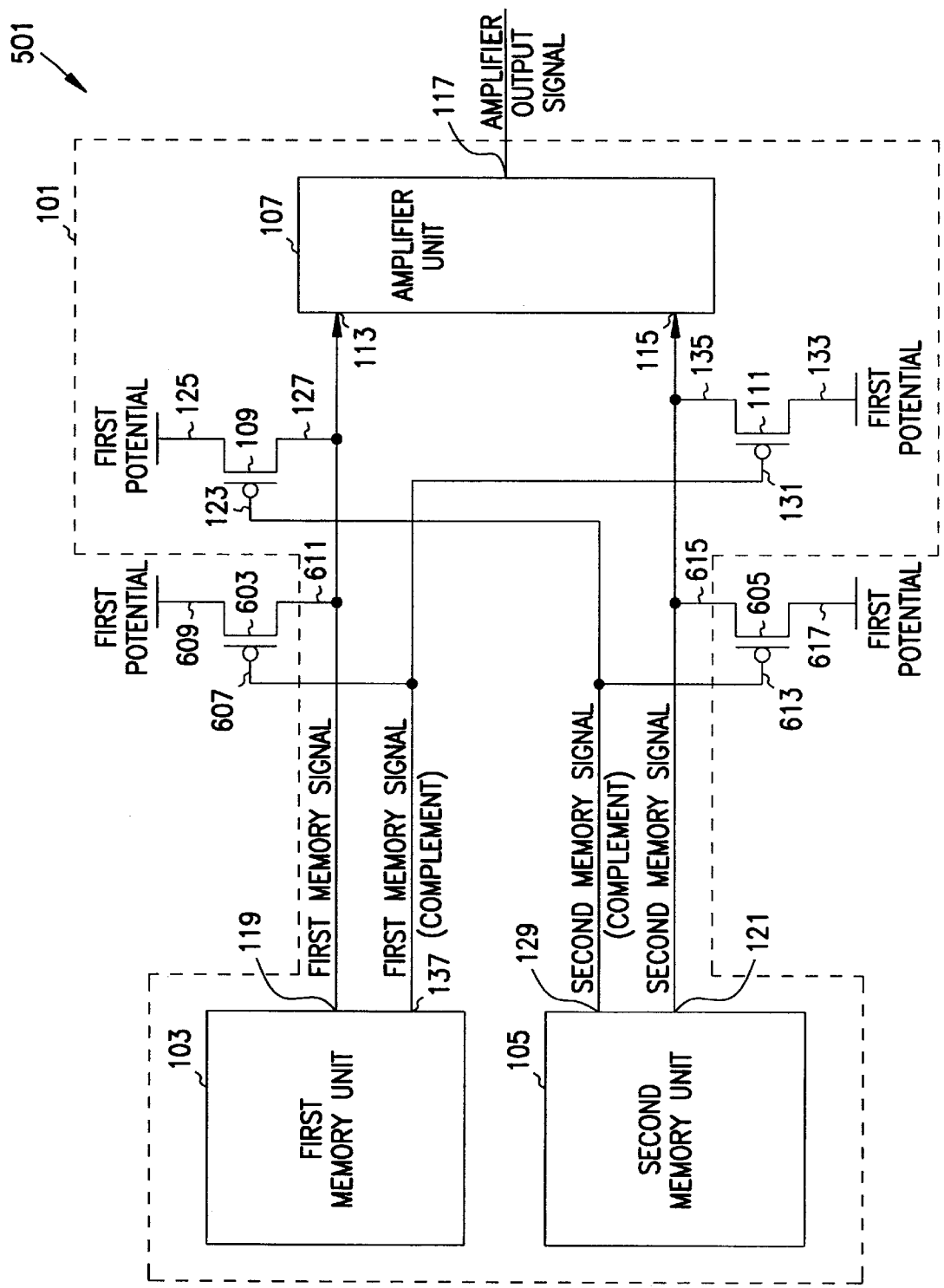
FIG. 6 is a block diagram of an alternative embodiment of a noise reduction circuit according to the teachings of the present invention.

FIG. 6 is a block diagram of an alternative embodiment of a noise reduction circuit 601 according to the teachings of the present invention. The noise reduction circuit 601 includes the noise reduction circuit 101 (shown in FIG. 1 and described above), and noise reduction transistors 603 and 605. The noise reduction transistor 603 includes a gate 607, a drain/source 609, and a drain/source 611. The gate 607 is coupled to the output port 137 of the first memory unit 103, the drain/source 609 is coupled to a first potential, and the drain/source 611 is coupled to the output port 119 of the first memory unit 103 and the input port 113 of the amplifier unit 107. The noise reduction transistor 605 includes a gate 613, a drain/source 615, and a drain/source 617. The gate 613 is coupled to the output port 129 of the second memory unit 105, the drain/source 615 is coupled to a first potential, and the drain/source 617 is coupled to the output port 121 of the second memory unit 105 and the input port 115 of the amplifier unit 107.

In a read operation of a logical one from the first memory unit 103, the FIRST MEMORY SIGNAL at output port 119 of the first memory unit 103 and the input port 113 of the amplifier unit 107 and the SECOND MEMORY SIGNAL at output port 121 of the second memory unit 105 and the input port 115 of the amplifier unit 107 include leakage noise. The leakage noise results from a leakage current that flows in pass transistors of bit cells in the first memory unit 103 that are not selected and in pass transistors of bit cells in the second memory unit 105. As the FIRST MEMORY SIGNAL and the SECOND MEMORY SIGNAL are held at a first potential, the FIRST MEMORY SIGNAL (COMPLEMENT) is pulled down toward a second potential. When the FIRST MEMORY SIGNAL (COMPLEMENT) reaches the threshold potential of the noise reduction transistor 603, the noise reduction transistor 603 turns on and holds the FIRST MEMORY SIGNAL at the output port 119 of the first memory unit 103 and the input port 113 of the amplifier unit 107 and the SECOND MEMORY SIGNAL at the output port 121 of the second memory unit 105 and the input port 115 of the amplifier unit 107 at about the first potential, which substantially cancels leakage noise on the FIRST MEMORY SIGNAL and the SECOND MEMORY SIGNAL.

In a read operation of a logical one from the second memory unit 105, the SECOND MEMORY SIGNAL at output port 121 of the second memory unit 105 and the input port 115 of the amplifier unit 107 and the FIRST MEMORY SIGNAL at output port 119 of the first memory unit 103 and the input port 113 of the amplifier unit 107 include leakage noise. The leakage noise results from a leakage current that flows in pass transistors of bit cells in the second memory unit 105 that are not selected and in pass transistors of bit cells in the first memory unit 103. As the SECOND MEMORY SIGNAL and the FIRST MEMORY SIGNAL are held at a first potential, the SECOND MEMORY SIGNAL (COMPLEMENT) is pulled down toward a second potential. When the SECOND MEMORY SIGNAL (COMPLEMENT) reaches the threshold potential of the noise reduction transistor 605, the noise reduction transistor 605 turns on and holds the SECOND MEMORY SIGNAL at the output port 121 of the second memory unit 105 and the input port 115 of the amplifier unit 107 and the FIRST MEMORY SIGNAL at the output port 119 of the first memory unit 103 at the input port 113 of the amplifier unit 107 at about the first potential, which substantially cancels leakage noise on the SECOND MEMORY SIGNAL and the FIRST MEMORY SIGNAL.

Figure 7:
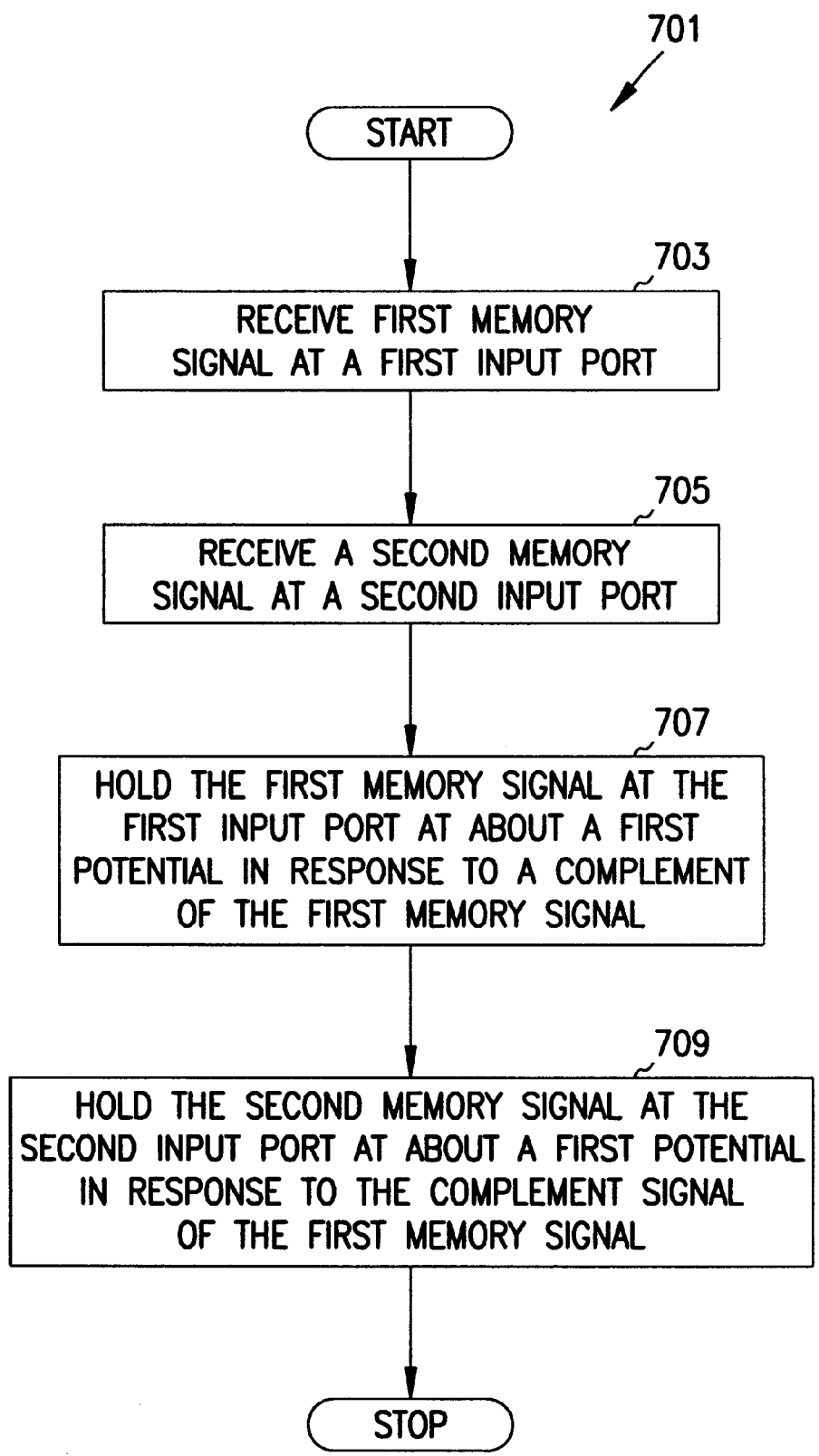
FIG. 7 is a flow diagram of an alternative embodiment of a method of reading a memory according to the teachings of the present invention.

FIG. 7 is a flow diagram of an alternative embodiment of a method 701 of reading a memory according to the teachings of the present invention. The method 701 includes receiving a first memory signal at a first input port of an amplifier at block 703, receiving a second memory signal at a second input port of the amplifier at block 705, holding the first memory signal at the first input port at about a first potential in response to a complement signal of the first memory signal at block 707, and holding the second memory signal at the second input port at about the first potential in response to the complement signal of the first memory signal at block 709. In an alternative embodiment, receiving a first memory signal at a first input port of an amplifier includes holding the first memory signal at about a first potential. In another alternative embodiment, receiving a second memory signal at a second input port of the amplifier includes holding the first memory signal at about a first potential. In another alternative embodiment, receiving a second memory signal at a second input port of the amplifier includes holding the second memory signal at about a first potential. In still another alternative embodiment, the method 701 of reading a memory further includes holding the first memory signal at the first input port at about the first potential in response to a complement signal of the second memory signal, and holding the second memory signal at the second input port at about the first potential in response to a complement signal of the second memory signal.

Figure 8:
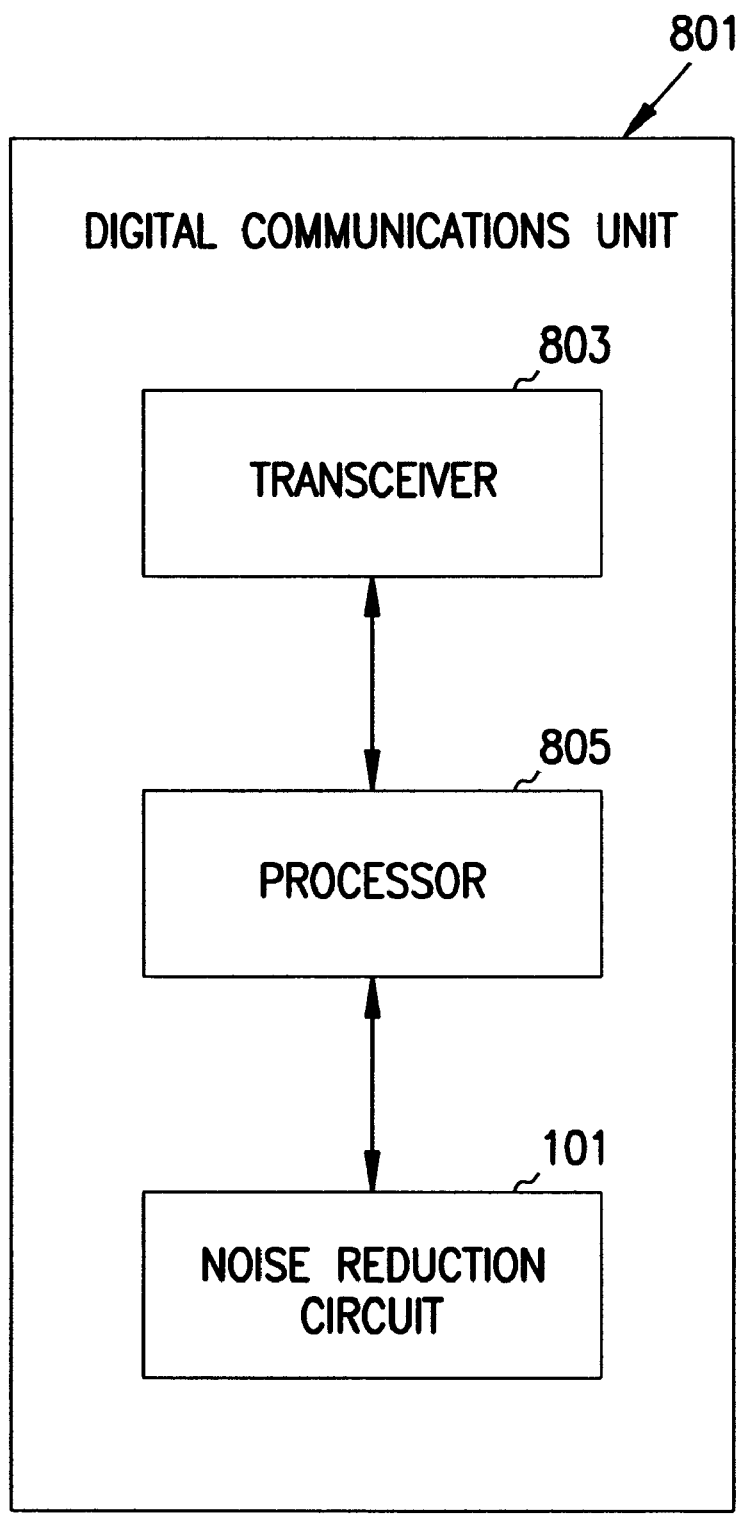
FIG. 8 is a block diagram of digital communication system suitable for use in connection with a noise reduction circuit according to the teachings of the present invention.

FIG. 8 is a block diagram of a digital communication unit 801 suitable for use in connection with the noise reduction circuit 101 according to the teachings of the present invention. The digital communication unit 801 is capable of sending and receiving information signals including but not limited to voice signals, data signals, and mixed voice and data signals. The digital communication unit 801 includes a transceiver unit 803, a processor unit 805 coupled to the transceiver unit 803, and a noise reduction circuit 101 coupled to the processor unit 805. The noise reduction circuit 101 includes the first memory unit 103 and the second memory unit 105 shown in FIG. 2. The transceiver unit 803 is not limited to a particular type of transceiver. Exemplary transceiver units suitable for use in connection with the present invention include radio frequency transceiver units and optical transceiver units. The processor unit 805 is not limited to a particular type of processor. Exemplary processor units suitable for use in connection with the present invention include microprocessors, digital signal processors, reduced instruction set processors, and complex instruction set computing systems. In one embodiment of the communication unit 801, the noise reduction circuit 101 comprises the noise reduction circuit 101 shown in FIG. 1. In an alternative embodiment of the communication unit 801, the noise reduction circuit 101 comprises the noise reduction circuit 101 shown in FIG. 6.

Although specific embodiments have been described and illustrated herein, it will be appreciated by those skilled in the art, having the benefit of the present disclosure, that any arrangement which is intended to achieve the same purpose may be substituted for a specific embodiment shown. This application is intended to cover any adaptations or variations of the present invention. Therefore, it is intended that this invention be limited only by the claims and the equivalents thereof.

What is claimed is:

1. A circuit comprising:
   an amplifier having a first input port coupled to a first memory signal and a second input port coupled to a second memory signal;
   a first transistor coupled to the first input port and capable of pulling up the first input port in response to a complement of the second memory signal; and
   a second transistor coupled to the second input port and capable of pulling up the second input port in response to a complement of the first memory signal.

2. The circuit of claim 1, wherein the amplifier comprises a single-ended sense amplifier.

3. The circuit of claim 2, wherein the single-ended sense amplifier comprises a complementary metal-oxide-semiconductor amplifier.

4. The circuit of claim 1, wherein the first memory signal comprises a static random-access-memory signal.

5. The circuit of claim 1, wherein the first transistor comprises a p-channel metal-oxide-semiconductor transistor.

6. The circuit of claim 5, wherein the second transistor comprises a p-channel metal-oxide-semiconductor transistor.

7. The circuit of claim 1, wherein the first transistor comprises a low threshold voltage transistor.

8. The circuit of claim 7, wherein the second transistor comprises a low threshold voltage transistor.

9. A method for reducing noise in a memory circuit, the method comprising:
   receiving a first memory signal at a first input port of an amplifier;
   receiving a second memory signal at a second input port of the amplifier; and
   holding the second memory signal at the second input port at about a first potential in response to a complement signal of the first memory signal.

10. The method of claim 9, wherein receiving a first memory signal at a first input port of an amplifier comprises:
    receiving the first memory signal having about the first potential at the first input port; and
    holding the first memory signal at about the first potential.

11. The method of claim 10, wherein receiving a second memory signal at a second input port of the amplifier comprises:
    receiving the second memory signal having about the first potential at the second input port; and
    holding the second memory signal at about the first potential.

12. The method of claim 10, wherein holding the first memory signal at about the first potential comprises:
    holding the first memory signal at about the first potential in response to a complement signal of the second memory signal.

13. A circuit comprising:
    an amplifier having a first input port coupled to a first memory signal and a second input port coupled to a second memory signal;
    a first pair of coupled transistors, wherein one of the first pair of coupled transistors is coupled to the first input port and is capable of pulling up the first input port in response to a complement of the first memory signal and one of the first pair of coupled transistors is coupled to the second input port and is capable of pulling up the second input port in response to a complement of the first memory signal; and
    a second pair of coupled transistors, wherein one of the second pair of coupled transistors is coupled to the first input port and is capable of pulling up the first input port in response to a complement of the second memory signal and one of the second pair of coupled transistors is coupled to the second input port and is capable of pulling up the second input port in response to a complement of the second memory signal.

14. The circuit of claim 13, wherein the amplifier comprises a single-ended sense amplifier.

15. The circuit of claim 14, wherein the single-ended sense amplifier comprises a complementary metal-oxide-semiconductor amplifier.

16. The circuit of claim 13, wherein the first pair of coupled transistors comprise a first pair of gate-coupled p-channel metal-oxide-semiconductor transistors.

17. The circuit of claim 16, wherein the second pair of coupled transistors comprise a second pair of gate-coupled p-channel metal-oxide-semiconductor transistors.

18. A method for reducing noise in a memory circuit, the method comprising:
    receiving a first memory signal at a first input port of an amplifier;
    receiving a second memory signal at a second input port of the amplifier;
    holding the first memory signal at the first input port at about a first potential in response to a complement signal of the first memory signal; and
    holding the second memory signal at the second input port at about the first potential in response to the complement signal of the first memory signal.

19. The method of claim 18, wherein receiving a first memory signal at a first input port of an amplifier comprises:
    holding the first memory signal at about a first potential.

20. The method of claim 19, wherein receiving a second memory signal at a second input port of the amplifier comprises:
    holding the second memory signal at about the first potential.

21. The method of claim 18, further comprising:
    holding the first memory signal at the first input port at about the first potential in response to a complement signal of the second memory signal; and
    holding the second memory signal at the second input port at about the first potential in response to a complement signal of the second memory signal.

22. A digital communication unit comprising:

a processor;

a noise reduction circuit coupled to the processor, the noise reduction circuit comprising:
- an amplifier having a first input port coupled to a first memory signal, a second input port coupled to a second memory signal, and a output port coupled to the processor;
- a first transistor coupled to the first input port and capable of pulling up the first input port in response to a complement of the second memory signal; and
- a second transistor coupled to the second input port and capable of pulling up the second input port in response to a complement of the first memory signal; and a transceiver coupled to the processor.

23. The digital communication unit of claim 22, wherein the processor is a digital signal processor.

24. The digital communication unit of claim 22, wherein the first transistor is a p-channel metal-oxide-semiconductor transistor.

* * * * *

UNITED STATES PATENT AND TRADEMARK OFFICE
CERTIFICATE OF CORRECTION

PATENT NO. : 6,351,156 B1
DATED : February 26, 2002
INVENTOR(S) : Hamzaoglu et al.

It is certified that error appears in the above-identified patent and that said Letters Patent is hereby corrected as shown below:

Title page,
Item [56], References Cited, U.S. PATENT DOCUMENTS, delete "365/206" and insert -- 365/208 --, therefor.

Column 1,
Line 44, delete "bitlines" and insert -- bit-lines --, therefor.

Column 3,
Line 15, delete "arc" and insert -- are --, therefor.

Signed and Sealed this

Seventeenth Day of September, 2002

Attest:

JAMES E. ROGAN
Attesting Officer    Director of the United States Patent and Trademark Office